United States Patent
Iannotti

(10) Patent No.: US 10,537,024 B2
(45) Date of Patent: Jan. 14, 2020

(54) PROCESS FOR FABRICATING PRINTED CIRCUIT ASSEMBLY AND PRINTED CIRCUIT ASSEMBLY THEREOF

(71) Applicant: GENERAL ELECTRIC COMPANY, Schenectady, NY (US)

(72) Inventor: Joseph Alfred Iannotti, Glenville, NY (US)

(73) Assignee: General Electric Company, Schenectady, NY (US)

( * ) Notice: Subject to any disclaimer, the term of this patent is extended or adjusted under 35 U.S.C. 154(b) by 57 days.

(21) Appl. No.: 15/883,664

(22) Filed: Jan. 30, 2018

(65) Prior Publication Data

US 2019/0239355 A1 Aug. 1, 2019

(51) Int. Cl.
H05K 1/14 (2006.01)
H05K 3/36 (2006.01)
H05K 1/02 (2006.01)

(52) U.S. Cl.
CPC ............ *H05K 1/147* (2013.01); *H05K 1/024* (2013.01); *H05K 1/144* (2013.01); *H05K 3/361* (2013.01); *H05K 2201/0145* (2013.01); *H05K 2201/0154* (2013.01); *H05K 2201/042* (2013.01); *H05K 2201/056* (2013.01)

(58) Field of Classification Search
CPC ........ H05K 1/147; H05K 1/024; H05K 1/144; H05K 3/361
USPC ........................................................ 174/254
See application file for complete search history.

(56) References Cited

U.S. PATENT DOCUMENTS

| 5,631,446 | A | 5/1997 | Quan |
| 7,525,498 | B2 | 4/2009 | Quan et al. |
| 8,026,774 | B2 | 9/2011 | Yagisawa et al. |
| 8,178,953 | B2 | 5/2012 | Barth et al. |
| 8,847,696 | B2 | 9/2014 | Blair et al. |
| 9,276,056 | B2 | 3/2016 | Akhtar et al. |
| 9,461,005 | B2 | 10/2016 | Weinschenk et al. |
| 9,496,596 | B2 | 11/2016 | Chirila |
| 2004/0264148 | A1* | 12/2004 | Burdick, Jr. ........ H01L 25/0657 361/748 |

(Continued)

OTHER PUBLICATIONS

Nick Pulsford "Passive integration technology: Targeting small, accurate RF part" Journal, defenseelectronicsmag.com, RF Cover Story, Nov. 2002, 4 pages.

(Continued)

*Primary Examiner* — Tremesha S Willis
(74) *Attorney, Agent, or Firm* — Phillip S. Hof; The Small Patent Law Group, LLC

(57) ABSTRACT

A process for fabricating a printed circuit assembly is presented. The process includes providing a first base substrate having a first surface and a second surface opposite to the first surface; providing a flexible circuit layer including a first region having a first set of signal traces and a second region having a second set of signal traces, wherein the first region and the second region are separated by a first intermediate region; disposing the first region of the flexible circuit layer on the first surface of the first base substrate; bending the flexible circuit layer at the first intermediate region to surround a thickness side of the first base substrate; and disposing the second region of the flexible circuit layer on the second surface of the first base substrate. A printed circuit assembly is also presented.

20 Claims, 7 Drawing Sheets

(56) References Cited

U.S. PATENT DOCUMENTS

| | | |
|---|---|---|
| 2012/0048610 A1 | 3/2012 | Hsu et al. |
| 2012/0152607 A1 | 6/2012 | Chen et al. |
| 2012/0280877 A1 | 11/2012 | Chirila |
| 2016/0242296 A1 | 8/2016 | Deangelis |
| 2018/0366059 A1* | 12/2018 | Lee .................... H01L 27/3267 |

OTHER PUBLICATIONS

Zhigang Wu et al. "Microfluidic Stretchable Radio-Frequency Devices" Journal, ieeexplore, Jul. 2015, 15 Pages.

* cited by examiner

PROCESS FOR FABRICATING PRINTED CIRCUIT ASSEMBLY AND PRINTED CIRCUIT ASSEMBLY THEREOF

Embodiments of the present disclosure generally relate to printed circuit assemblies, and more particularly to radio-frequency (RF) interconnects.

BACKGROUND

Radio-frequency (RF) circuits including passive RF sensing systems may be utilized for many applications such as surface acoustic wave (SAW) sensing. In these RF circuits, several RF interconnects that may include RF controlled impedance lines and antennas may require a signal conductive layer and a ground conductive layer. Typically, these RF circuits employing RF interconnects are fabricated though the use of microstrip transmission lines and/or patch antennas.

Microstrip transmission lines generally include a dielectric substrate having signal conductive layer positioned on a surface of the dielectric substrate and a ground conductive layer positioned on opposite surface of the dielectric substrate. The signal conductive layer and the ground conductive layer are electrically connected through via-holes in the dielectric substrate and interact with each other to create an electromagnetic wave that travels through dielectric substrate to create a RF signal. The performance of the microstrip transmission lines (RF circuits) may depend on various parameters including width of the microstrip transmission lines, the thickness of the dielectric substrate, and the relative dielectric constant of the material of the dielectric substrate. Though the performance of the microstrip transmission line (RF circuits) may be improved by increasing the thickness of the dielectric substrate, the potential limitations may exist with respect to the fabrication complexity and cost. For example, one of the major challenge in fabricating such RF interconnects may be creation of via-holes in a thick dielectric substrate.

There is a need for alternative configurations and processes for fabricating printed circuit assemblies such as RF interconnects, which provide simplified and cost-effective means of fabrication and improved reliability.

BRIEF DESCRIPTION

In one aspect, provided herein is a process for fabricating a printed circuit assembly. The process includes providing a first base substrate having a first surface and a second surface opposite to the first surface; providing a flexible circuit layer including a first region having a first set of signal traces and a second region having a second set of signal traces, wherein the first region and the second region are separated by a first intermediate region; disposing the first region of the flexible circuit layer on the first surface of the first base substrate; bending the flexible circuit layer at the first intermediate region to surround a thickness side of the first base substrate; and disposing the second region of the flexible circuit layer on the second surface of the first base substrate.

In one aspect, a printed circuit assembly includes a first base substrate having a first surface and a second surface opposite to the first surface; and a flexible circuit layer including a first region having a first set of signal traces and a second region having a second set of signal traces separated from the first region by a first intermediate region. The flexible circuit layer is disposed on the first base substrate such that the first region is disposed on the first surface and the second region is disposed on the second surface, and the first set of signal traces and the second set of signal traces are operatively coupled via the first intermediate region.

These and other features, embodiments, and advantages of the present disclosure may be understood more readily by reference to the following detailed description.

DRAWINGS

These and other features, aspects, and advantages of the present disclosure will become better understood when the following detailed description is read with reference to the accompanying drawings in which like characters represent like parts throughout the drawings, wherein.

Figure 1:
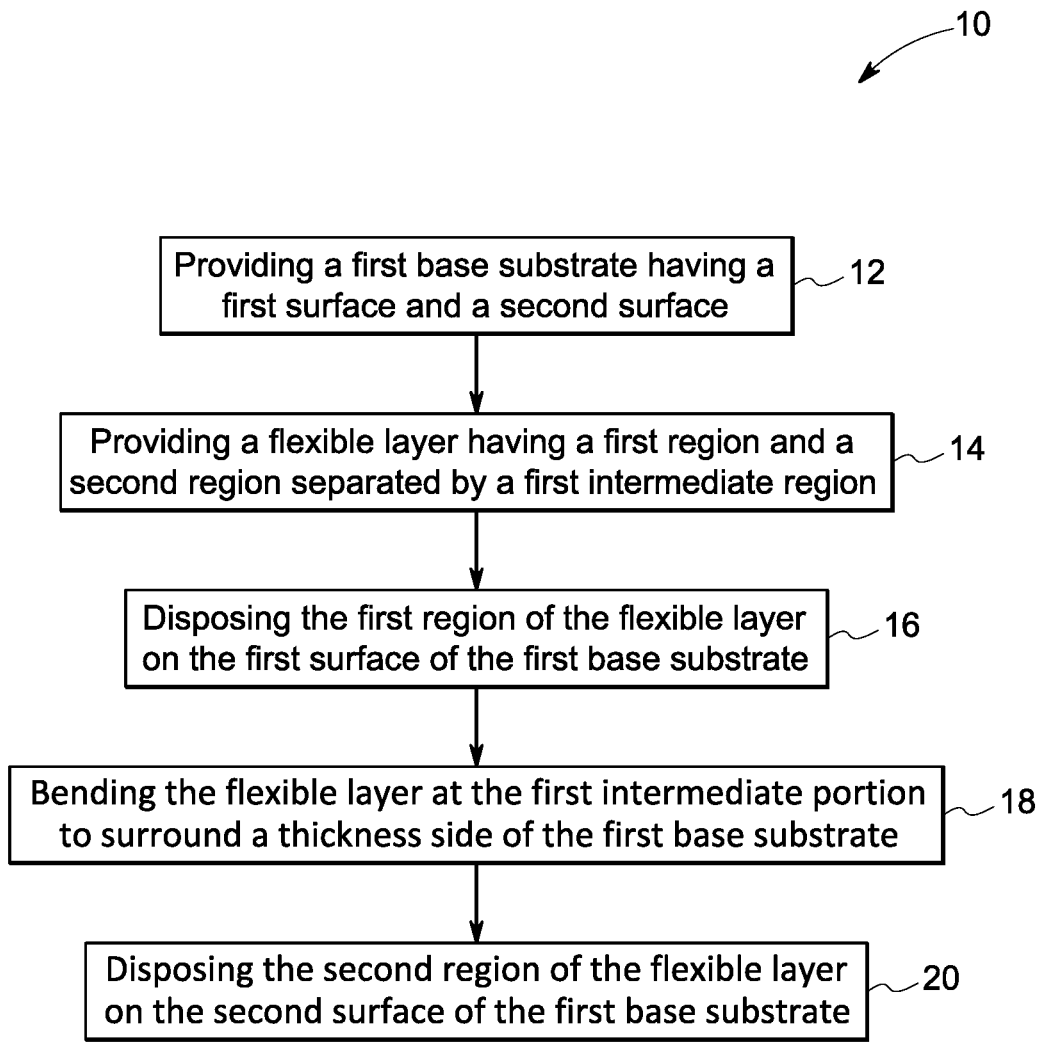
FIG. 1 is a flow chart of a process for fabricating a printed circuit assembly, in accordance with one embodiment.
Figure 4:
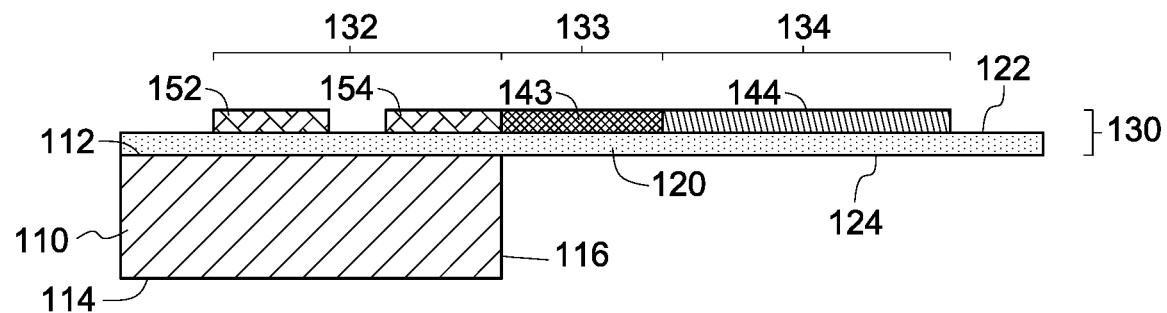
Figure 5:
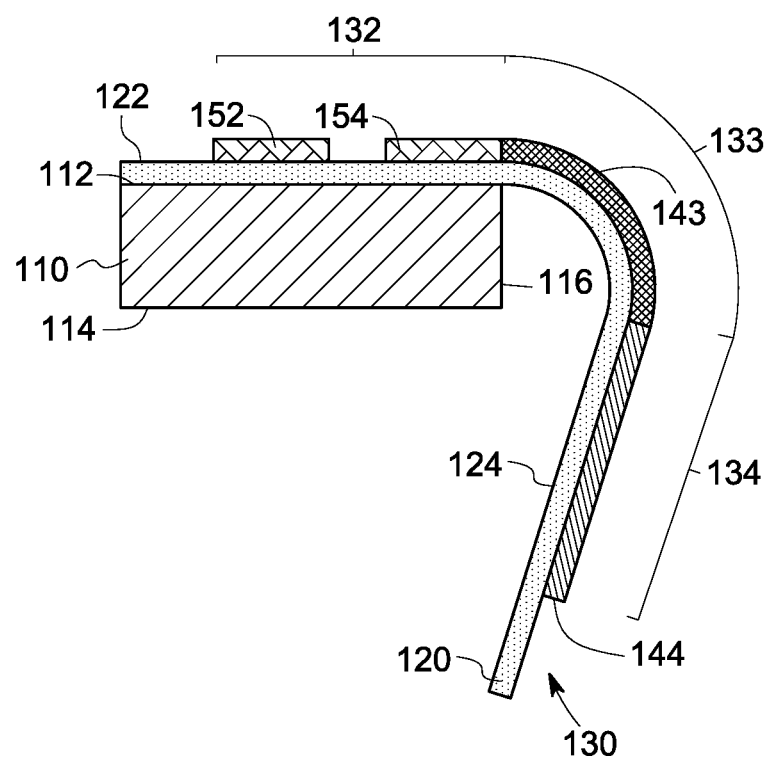
Figure 6:
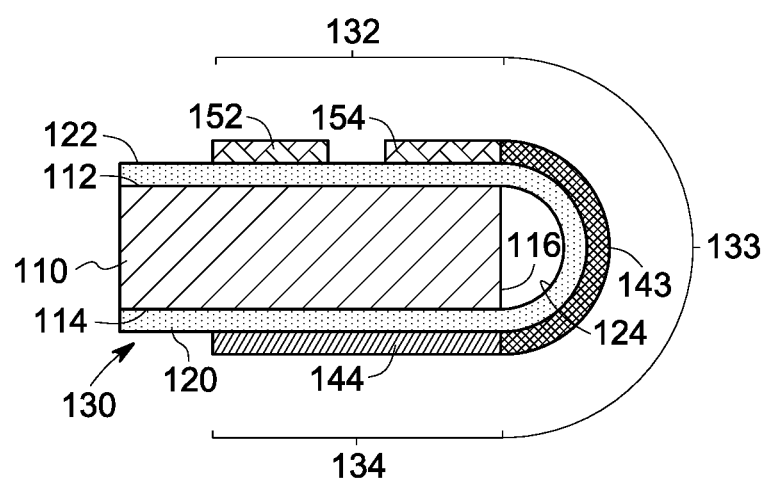
Figure 7:
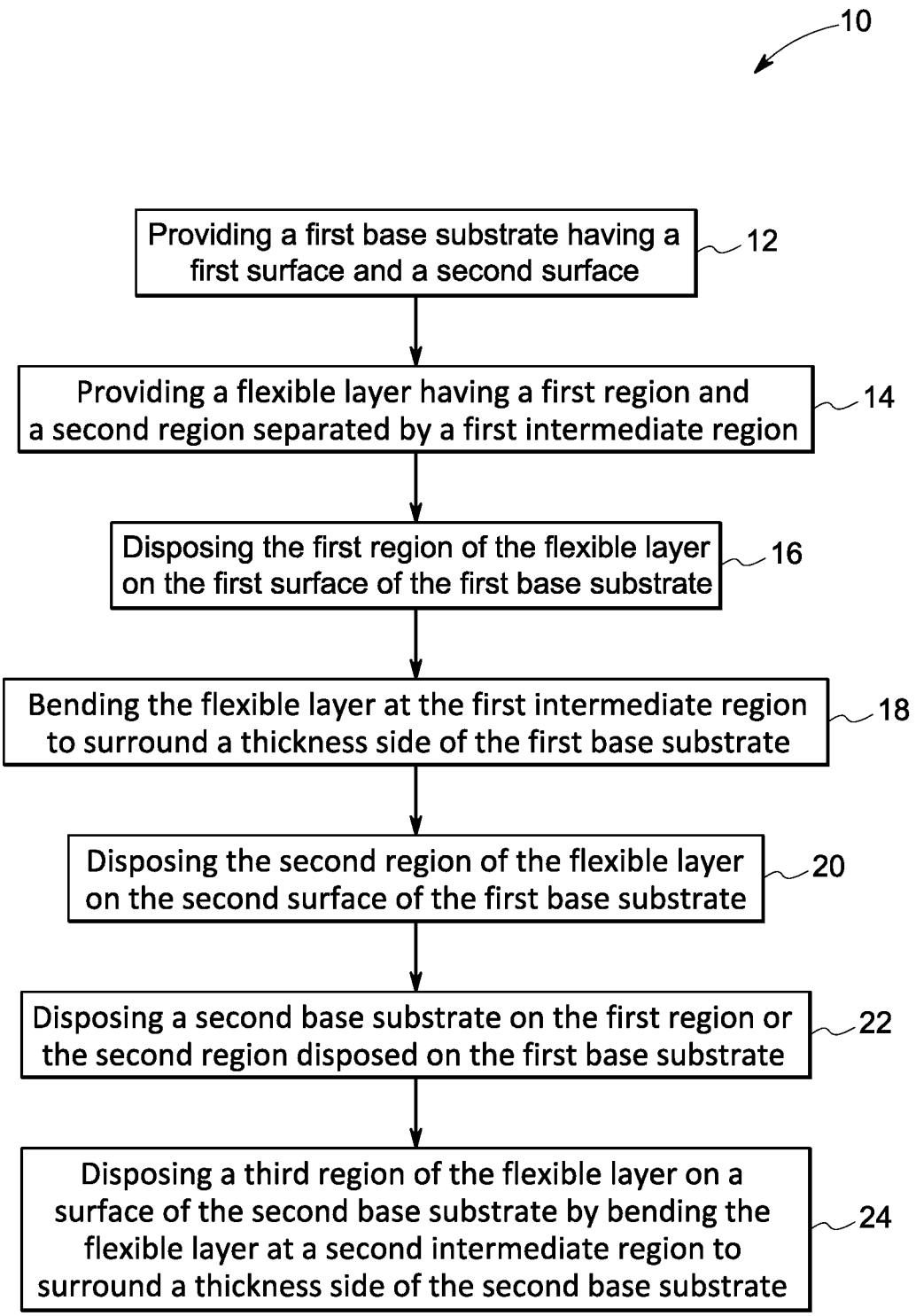
Figure 8:
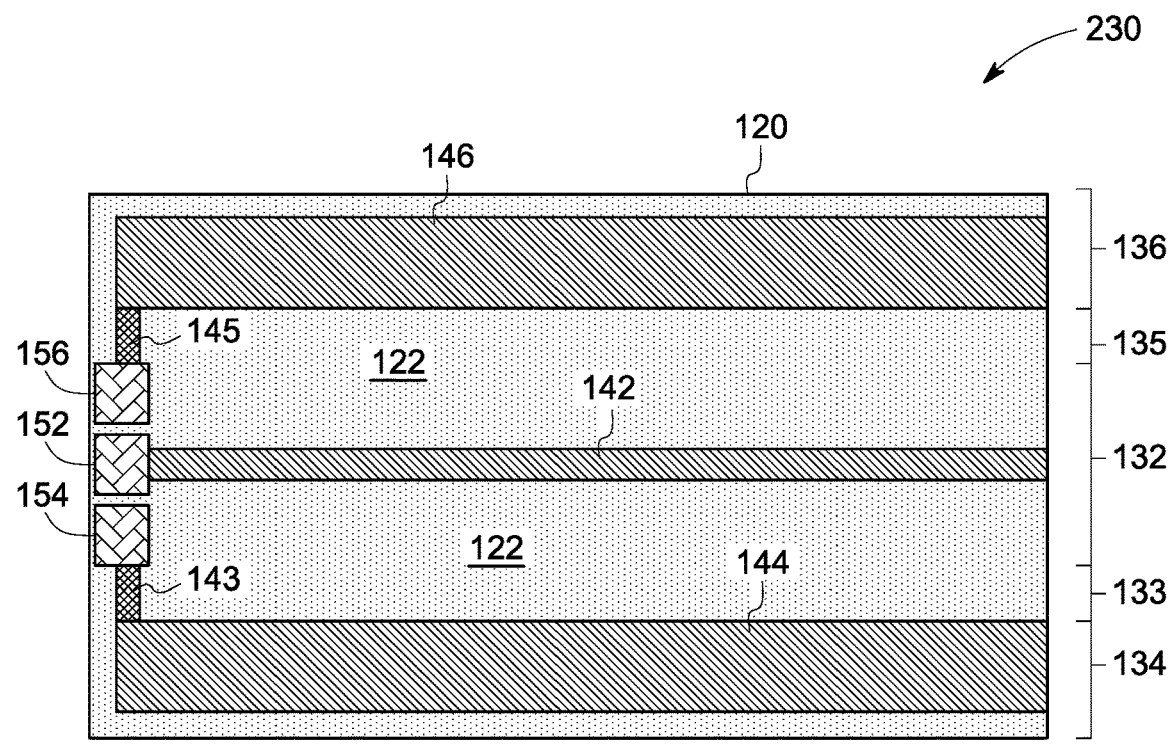
Figure 9:
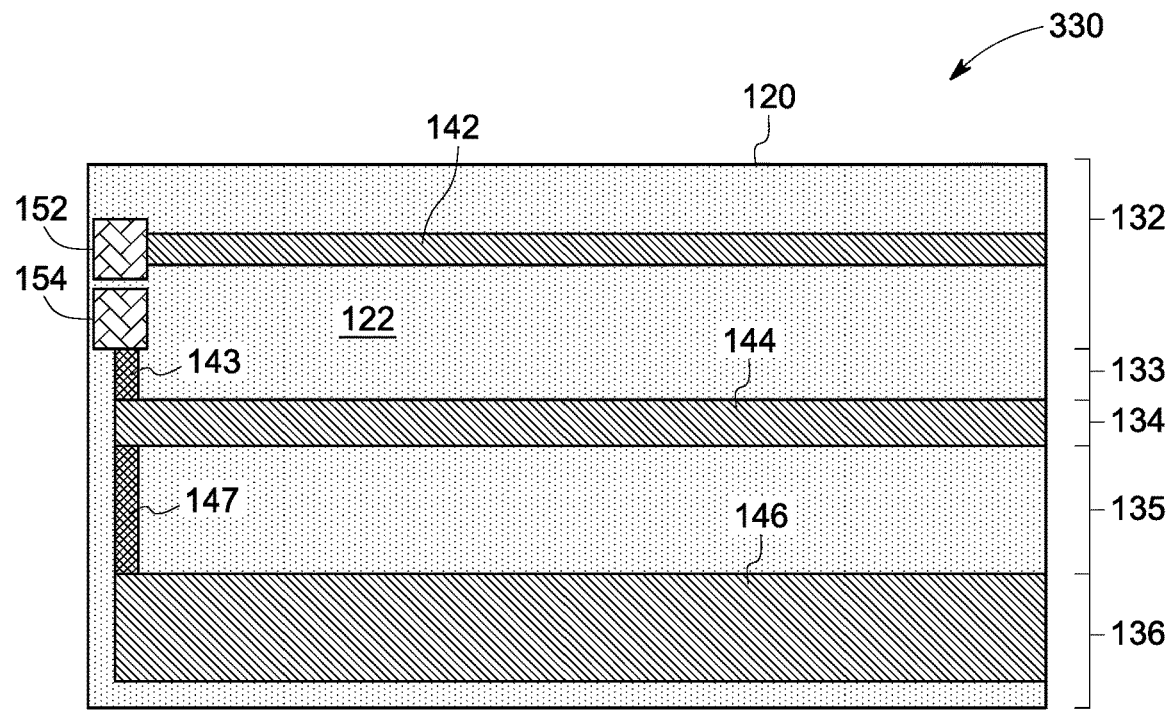
Figure 10:
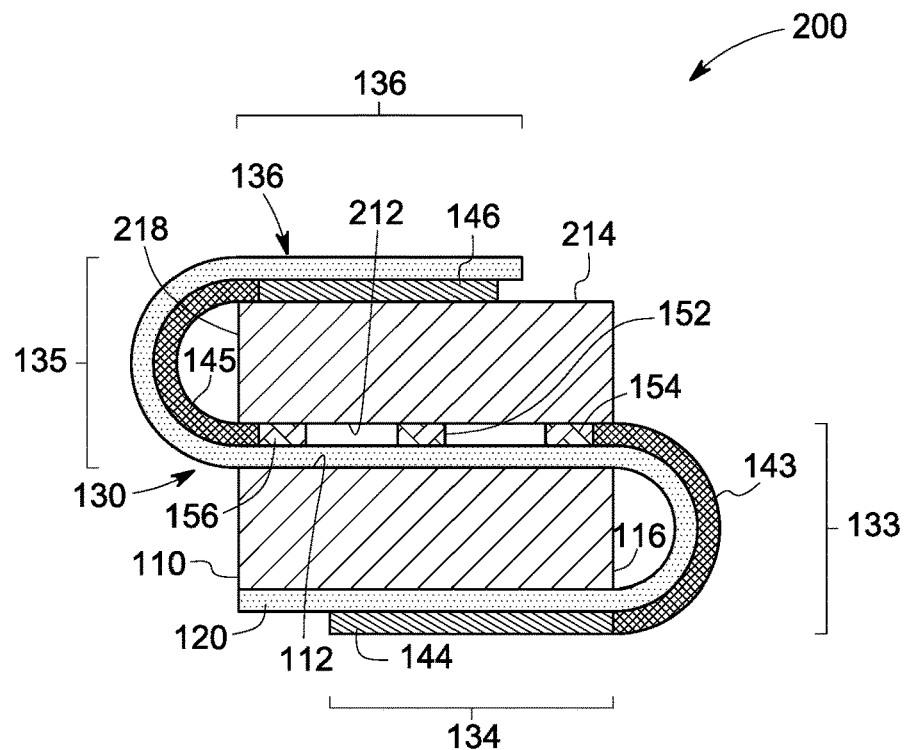
Figure 11:
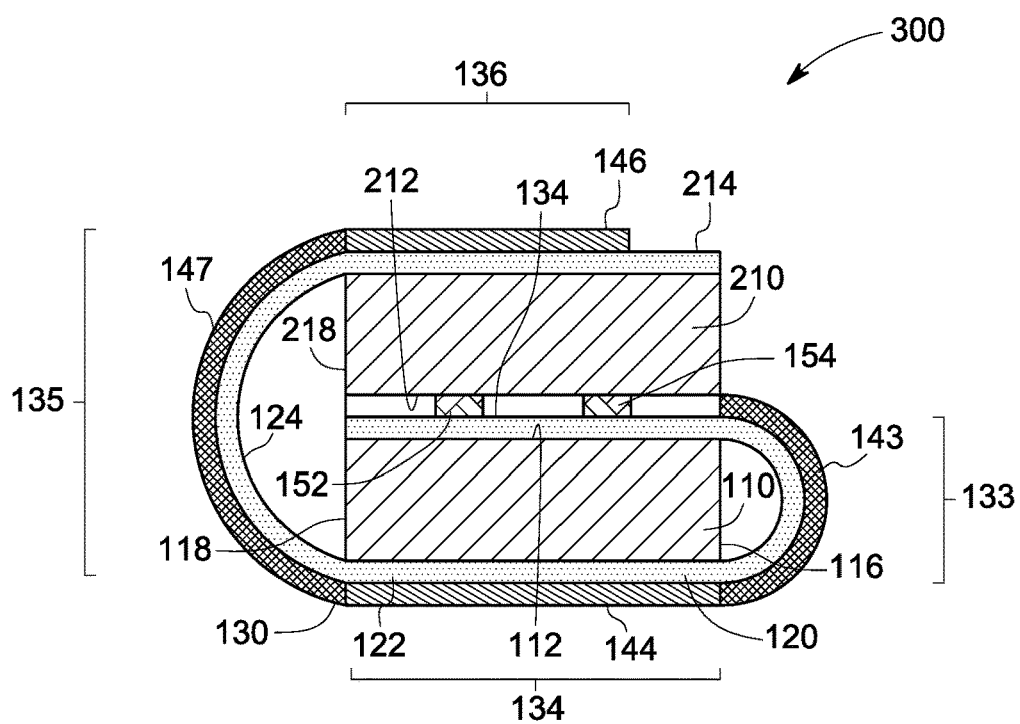

FIG. 4 schematically represents a process step of the process of FIG. 1, in accordance with one embodiment;

FIG. 5 schematically represents a process step of the process of FIG. 1, in accordance with one embodiment;

FIG. 6 schematically represents a process step of the process of FIG. 1 to form the printed circuit assembly, in accordance with one embodiment;

FIG. 7 is a flow chart of a process for fabricating a stacked printed circuit assembly, in accordance with another embodiment;

FIG. 8 shows a schematic top view of a flexible circuit layer, in accordance with another embodiment;

FIG. 9 shows a schematic top view of a flexible circuit layer, in accordance with yet another embodiment;

FIG. 10 shows a schematic of a cross-section view of a printed circuit assembly, in accordance with another embodiment; and FIG. 11 shows a schematic of a cross-section view of a printed circuit assembly, in accordance with yet another embodiment.

It is noted that the drawings of the disclosure are not to scale. The drawings are intended to depict only typical aspects of the disclosure, and therefore should not be considered as limiting the scope of the disclosure.

DETAILED DESCRIPTION

As discussed in detail below, some embodiments of the present disclosure provide simple and cost-effective processes for fabricating a printed circuit assembly. More particularly, some embodiments relate to processes for fabricating a RF interconnect for use in integrated circuit packages. The processes and configurations, as described herein, advantageously provide printed circuit assemblies that eliminate the need of via-holes. In addition, the processes and configurations exhibit reduced losses and improved efficiencies (as compared to that of conventional assemblies) by enabling use of thick dielectric substrates.

In the following specification and the claims, the singular forms "a", "an" and "the" include plural referents unless the context clearly dictates otherwise. Approximating language, as used herein throughout the specification and claims, may be applied to modify any quantitative representation that could permissibly vary without resulting in a change in the basic function to which it is related. Accordingly, a value modified by a term or terms, such as "about" and "substantially", is not limited to the precise value specified. In some instances, the approximating language may correspond to the precision of an instrument for measuring the value.

Unless defined otherwise, technical and scientific terms used herein have the same meaning as is commonly understood by one of skill in the art to which this invention belongs. The terms "comprising," "including," and "having" are intended to be inclusive, and mean that there may be additional elements other than the listed elements. The terms "first", "second", and the like, as used herein do not denote any order, quantity, or importance, but rather are used to distinguish one element from another.

As used herein, the term "layer" refers to a material in two-dimensional form. A layer may include a sheet, a foil, a thin film, a covering, a coating, or a material disposed on at least a portion of an underlying surface in a continuous or discontinuous manner. Further, the term "layer" does not necessarily have a uniform thickness, a layer may have a uniform or a variable thickness. As used herein, the term "disposed on" refers to layers disposed directly in contact with an underlying surface or indirectly by having intervening layers therebetween, unless otherwise specifically indicated. Further, the term "on" describes the relative position of a layer and an underlying surface and does not necessarily mean "on top of" since the relative position above or below depends upon the orientation of a device or an assembly to the viewer. Moreover, the use of "top," "bottom," "above," "below," or variations of these terms is made for convenience, and does not require any particular orientation of the components unless otherwise stated.

As used herein, the term "flexible circuit layer" refers to a pattern of signal traces disposed (for example, printed) on a flexible substrate. A flexible circuit layer may include metallic layers of signal traces disposed on a dielectric layer. The flexible circuit layer may also be referred to as flexible patterned layer.

As used herein, the term "signal traces" is equivalent of wires for conducting signals. In some embodiments, the signal traces may be deposited or printed metal circuit for conducting signals. These signal traces may also be referred to as "printed conductors." In some embodiments, the signal traces may be printed on the dielectric layer using additive manufacturing. The signal traces may include transmission lines such as RF transmission lines. Various configuration may be formed by disposing a plurality of transmission lines for various electronic devices. Examples include stripline transmission line, microstrip transmission line, differential transmission line, controlled impedance lines or combinations thereof.

Some embodiments of the present disclosure are directed to a process for fabricating a printed circuit assembly. The process includes providing a first base substrate having a first surface and a second surface opposite to the first surface, providing a flexible circuit layer comprising a first region having a first set of signal traces and a second region having a second set of signal traces separated by a first intermediate region, disposing the first region of the flexible circuit layer on the first surface of the first base substrate, bending the flexible circuit layer at the first intermediate region to surround a thickness side of the first base substrate and disposing the second region of the flexible circuit layer on the second surface of the first base substrate. In some embodiments, the first base substrate is free of via-holes. In some embodiments, the first set of signal traces and the second set of signal traces are operatively coupled via the first intermediate region.

As used herein, the term "operatively coupled" or "operatively couples" means that two or more sets of signal traces are coupled to form a circuit. In one embodiment, current flows in the circuit in an active state. In some embodiments, the two or more sets of signal traces are electrically connected to respective terminals that may be connected an external source for activating the circuit. In some embodiments, one of the two or more terminals may be a signal terminal and at least one other terminal of the two or more terminals may be a ground terminal. In some embodiments, current flows in the circuit when a potential is applied to the two or more terminals.

In some embodiments, the process further includes disposing a second base substrate on the first region or the second region of the flexible circuit layer disposed on the first base substrate and disposing a third region having a third set of signal traces of the flexible circuit layer on a surface of the second base substrate by bending the flexible circuit layer at a second intermediate region. The third region is separated from the first region or the second region by the second intermediate region. In some embodiments, the third set of signal traces is operatively coupled to the first set of the signal traces or the second set of the signal traces via the second intermediate region. In some embodiments, the second base substrate is free of via-holes.

In some embodiments, a process for fabricating a printed circuit assembly, such as, but not limited to, a RF interconnect is described with reference to FIGS. 1-6. FIG. 1 shows a flow chart of a process 10 for fabricating a printed circuit assembly 100 as shown in FIG. 6, in accordance with some embodiments. The process steps of the process 10 are schematically represented in FIGS. 2-6, according to some embodiments.

Figure 2:
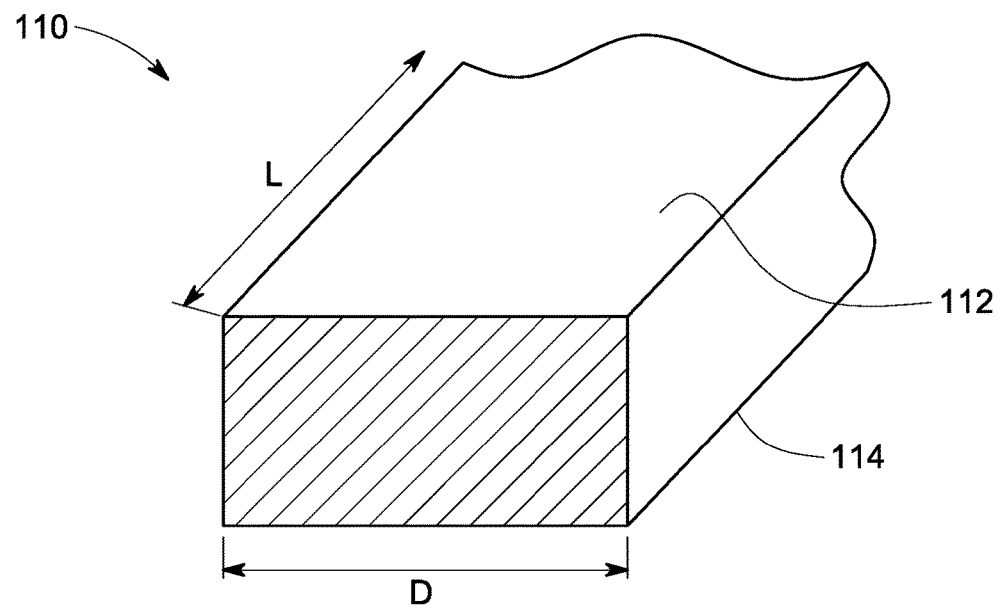
FIG. 2 shows a schematic view of a base substrate, in accordance with one embodiment.

Referring to FIGS. 1 and 2, in some embodiments, the process 10 includes the step 12 of providing a first base substrate 110. The first base substrate 110 may comprise a dielectric material. A dielectric material for the first base substrate 110 may be suitable based on its electrical, mechanical and thermal properties. In some embodiments, the dielectric material has a dielectric constant less than 5. The dielectric material may include an inorganic material, an organic material, a glass, or a combination thereof. In some embodiments, the inorganic dielectric material includes a ceramic such as alumina. Other examples of inorganic dielectric materials are co-fired ceramics such as high temperature co-fired ceramic (HTCC), low temperature co-fired ceramics (LTCC). Suitable examples of organic materials include a polyimide and polyethylene terephthalate (PET). An example of glass is such as Mylar glass. In some embodiments, the first base substrate 110 may include the dielectric material in porous form, for example a dielectric foam. The porous form of the dielectric material may help in lowering the dielectric constant of the first base substrate 110 and improving the performance of the printed circuit assembly 100. The first base substrate 110 may be bar-shaped having a cross section of a polygon such as square, rectangle or an ellipse. In some embodiments, as illustrated in FIG. 2, the first base substrate 110 has a rectangular cross section, and has a length 'l', a width 'd' and a thickness 't'. The first base substrate 110 has a first surface 112 and a second surface 114 opposite to the first surface 112, that are perpendicular to the thickness 't'. The thickness of the first base substrate 110 may vary in a range from about 0.25 millimeters to about 10 millimeters. In some embodiments, the thickness of the first base substrate 110 is in a range from about 1 millimeters to about 3 millimeters.

Figure 3:
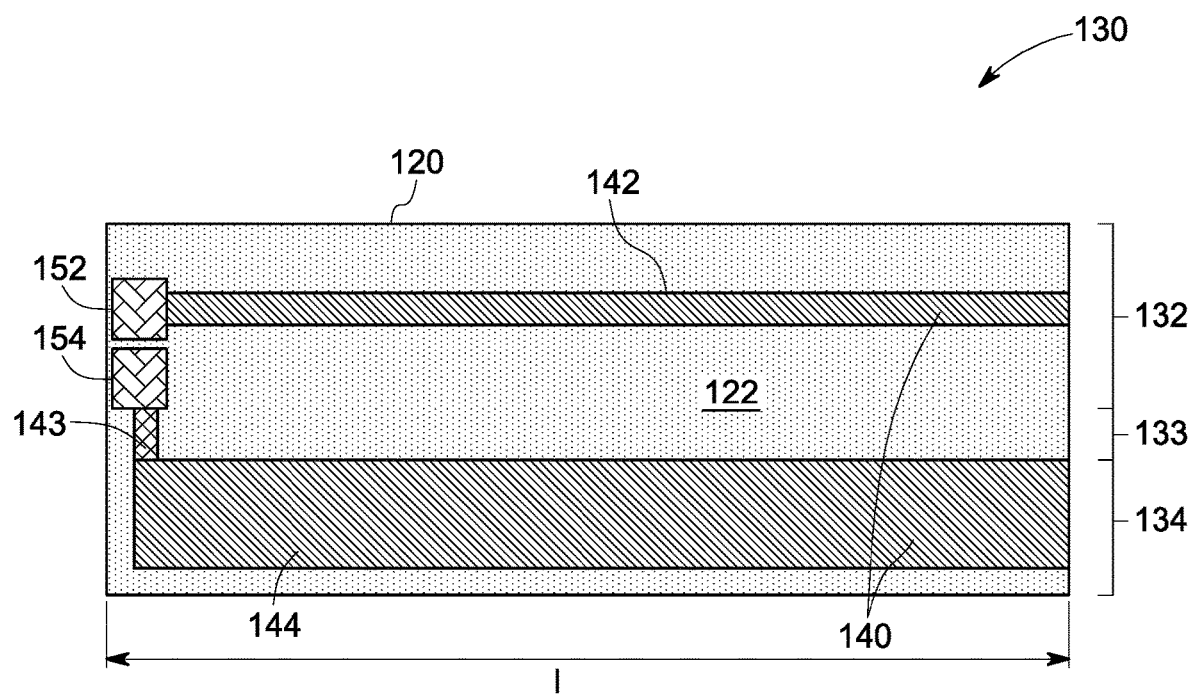
FIG. 3 shows a schematic top view of a flexible circuit layer, in accordance with one embodiment.

Referring to FIGS. 1 and 3, the process 10 further includes the step 14 of providing a flexible circuit layer 130, in some embodiments. FIG. 3 depicts a flexible circuit layer 130, in some embodiments. As illustrated in FIG. 3, the flexible circuit layer 130 includes a dielectric layer 120 having a front surface 122 and a back surface 124 (not visible in FIG. 3) opposing the front surface 122; and a plurality of signal traces 140 disposed on the front surface 122 of the dielectric layer 120.

In some embodiments, the dielectric layer 120 includes a dielectric material having a dielectric constant less than 5. A dielectric material for the dielectric layer 120 may be suitable based on its electrical, mechanical and thermal properties. The dielectric material for the dielectric layer 120 may include an organic material, an inorganic material, a glass or combinations thereof. In some embodiments, the organic material for the dielectric layer 120 includes polyethylene terephthalate (PET), a polyimide, or a combination thereof. Suitable examples of the dielectric material for the dielectric layer 120 include Kapton® and Upilex®. An example of glass is mylar glass. In certain embodiments, the dielectric layer 120 is a thin film of Kapton®, Upilex® or PET. Other materials suitable for the dielectric layer 120 may include Teflon™ and Kevlar®. In some embodiments, the dielectric layer 120 has a thickness in a range from about 10 microns to about 100 microns. In certain embodiments, the dielectric layer 120 has a thickness in a range of from about 30 microns to about 80 microns.

Referring to FIG. 3, the flexible circuit layer 130 may have a first region 132, a second region 134 and a first intermediate region 133 separating the first region 132 and the second region 134. Each region, the first region 132, the second region 134 and the first intermediate region 133, may extend along a dimension such as length 'L' of the flexible circuit layer 130 as illustrated. In some embodiments, the first region 132 includes a first set of signal traces 142 of the plurality of signal traces 140 disposed on the front surface 122 of the dielectric layer 120 and the second region 134 includes a second set of signal traces 144 of the plurality of signal traces 140 disposed on the front surface 122 of the dielectric layer 120. As alluded, the first region 132 and the second region 134 are separated by the first intermediate region 133. The first intermediate region 133 does not include signal traces i.e., the first intermediate region is free of signal traces. In some embodiments, a width of the first intermediate region 133 may be equal to or greater than the thickness 't' of the first base substrate 110 (FIG. 2).

In some embodiments, the first set of signal traces 142 disposed in the first region 132 and the second set of signal traces 144 disposed in the second region 134 are operatively coupled via the first intermediate region 133. As illustrated in FIG. 2, the first set of signal traces 142 may be electrically connected to a first terminal 152 and the second set of signal traces 144 may be electrically connected to a second terminal 154. The first terminal 152 and the second terminal 154 are disposed on the front surface 122 and in the first region 132 of the dielectric layer 120. In some embodiments, the first terminal 152 may be a signal terminal and the second terminal 154 is a ground terminal. The first intermediate region 133 includes an electrical interconnect 143, for example a metal contact connecting the second terminal 154 to the second set of signal traces 144 disposed in the second region 134.

Referring to FIG. 1, the step 12 of providing the flexible circuit layer may include either procuring pre-fabricated flexible circuit layer 130 or forming the flexible circuit layer 130 by disposing the plurality of signal traces 140, the first and second terminals (152, 154) and the electrical interconnect 143 on the front surface 122 of the dielectric layer 120. In some embodiments, the plurality of signal traces 140 is deposited on the front surface 122 of the dielectric layer 120 by using a known deposition technique for example, including etching and subtractive techniques. In some embodiments, the plurality of signal traces 140 is deposited on the front surface 122 of the dielectric layer 120 by using an additive manufacturing technique, for example Direct Metal Laser melting (DMLM).

In some embodiments, the step of forming the flexible circuit layer 130 includes depositing/fabricating the first set of signal traces 142 on the front surface 122 in a first portion of the dielectric layer 120 to form the first region 132, and depositing the second set of signal traces 144 on the front surface 122 in a second portion of the dielectric layer 120 to form the second region 134. The first set of signal traces 142 and the second set of signal traces 144 extend along the length 'L' of the flexible circuit layer 130. The step of forming the flexible circuit layer 130 further includes disposing the first terminal 152, the second terminal 154 on the front surface 122 in the first region 132 and disposing the electrical interconnect 143 on the front surface 122 across the first intermediate region 133 of the dielectric layer 120. The electrical interconnect 143 electrically connects the second terminal 154 to the second set of signal traces 144.

Referring to FIGS. 1-4, the process 10 includes the step 16 of disposing the first region 132 of the flexible circuit layer 130 on the first surface 112 of the first base substrate 110. The flexible circuit layer 130 is disposed on the first surface 112 such that the flexible circuit layer 130 extends lengthwise along the length 'l' of the first base substrate 110. Further, the first region 132 of flexible circuit layer 130 is disposed on the first base substrate 110 such that the back surface 124 of the dielectric layer 120 of the first region 132 is in contact with the first surface 112. The back surface 124 of the dielectric layer 120 may be attached using an adhesive or any other suitable means. In some embodiments, the first region 132 conforms to the entire first surface 112 of the first base substrate 110. In these embodiments, the remaining portion of the flexible circuit layer 130 extends outside the first base substrate 110. In the next step 18, the process 10 includes bending the flexible circuit layer 130 at the first intermediate region 133 to surround a thickness side 116 of the first base substrate 110, as illustrated in FIG. 5. The first intermediate region 133 may completely surround the thickness side 116. In such embodiments, the back surface 124 of the first intermediate region 133 of the dielectric layer 120 faces the thickness side 116 of the first base substrate 110.

After the bending step 18, the process 10 includes the step 20 of disposing the second region 134 of the flexible circuit layer 130 on the second surface 114 of the first base substrate 110 as illustrated in FIG. 6. The second region 134 is disposed on the second surface 114 such that the back surface 124 of the dielectric layer 120 of the second region 134 is in contact with the second surface 114 of the first base substrate 110. In some embodiments, the second region 134 conforms to the entire second surface 114 of the first base substrate 110. On completion of the step 20, the process 10 forms the printed circuit assembly 100 as shown in FIG. 6.

Some embodiments of the present disclosure are directed to a printed circuit assembly, for example the printed circuit assembly as illustrated in FIG. 6. The printed circuit assembly 100 may be a RF interconnect. The printed circuit assembly 100 includes a first base substrate 110 having a first surface 112 and a second surface 114 opposite to the first surface 112; and a flexible circuit layer 130 including a first region 132 having a first set of signal traces 142 and a second region 134 having a second set of signal traces, the first region 132 and the second region 134 are separated by a first intermediate region 133. The flexible circuit layer 130 is disposed on the first base substrate 110 such that the first region 132 is disposed on the first surface 112 and the second region 134 is disposed on the second surface 114. The first set of signal traces 142 and the second set of signal traces 144 are operatively coupled via the first intermediate region 133. In some embodiments, the first base substrate 110 is free of via-holes.

Depending on the application and variations in design, a printed circuit assembly of various configurations such as a stacked printed circuit assembly may be fabricated. In some embodiments, after performing the step 18, the process 10 may further include the step 22 of disposing a second base substrate on the first region of the flexible circuit layer disposed on the first base substrate and the step 24 of disposing a third region having a third set of signal traces of the flexible circuit layer on a surface of the second base substrate, as illustrated in FIG. 7, to form a stacked printed circuit assembly.

FIGS. 10 and 11 show stacked printed circuit assemblies 200 and 300 exhibiting stripline transmission lines configuration, in some embodiments. In these embodiments, a flexible circuit layer may include a first region and a second region separated by a first intermediate region and a third region separated from the first region or the second region by a second intermediate region. FIG. 8 and FIG. 9 illustrate flexible circuit layers 230 and 330 having the first region 132 and the second region 134 separated by the first intermediate region 133 (similar to the flexible circuit layer 130 of FIG. 3) and a third region 136 separated from the first region 132 or the second region 134 by a second intermediate region 135. Similar to the first region 132 and the second region 134, the third region 136 may extend to the length of the flexible circuit layer 130.

In embodiments shown in FIG. 8, the third region 136 is separated from the first region 132 by the second intermediate region 135. The second intermediate region 135 is free of signal traces. In some embodiments, the second intermediate region 135 includes an electrical interconnect 145 disposed on the front surface 122 of the dielectric layer 120, which operatively couples the third set of signal traces 146 to the first set of signal traces 142. As illustrated, a third terminal 156 is disposed in the first region 132 proximate to the first terminal 152. The third set of signal traces 146 of the third region 136 is electrically connected to the third terminal 156 (i.e., a ground terminal) via the electrical interconnect 145 to form a circuit.

In embodiments shown in FIG. 9, the third region 136 is separated from the second region 134 by the second intermediate region 135. The second intermediate region 135 is free of signal traces. In some embodiments, the second intermediate region 135 includes an electrical interconnect 147 disposed on the front surface 122 of the dielectric layer 120, which operatively couples the third set of signal traces 146 to the second set of signal traces 144.

Referring to FIG. 7-9, in some embodiments, the step 12 of providing the flexible circuit layer may include either procuring pre-fabricated flexible circuit layer (230, 330) or forming the flexible circuit layer (230, 330) by disposing the first set of signal traces 142, the second set of signal traces 144, the first terminal 152, the second terminal 154, and the electrical interconnects 143 on the front surface 122 of the dielectric layer 120. In some embodiments, the step of forming the flexible circuit layer (230 or 330) as shown in FIG. 8 or 9 may further include disposing the third set of signal traces 146 on the front surface 122 in a third portion of the dielectric layer 120 to form the third region 136 and disposing an electrical interconnect (145 or 147) on the front surface 122 of the dielectric layer 120 in the second intermediate region 135 to operatively couple the third set of signal traces 146 to the first set of signal traces 142 or the second set of signal traces 144.

Referring to FIGS. 7-11, in some embodiments, the process 10 further includes the step 22 of disposing a second base substrate 210 on the first region 132 that is disposed on the first surface 112 of the first base substrate 110 after performing the step 18. The second base substrate 210 may be same or different in shape and size from the first base substrate 110. In some embodiments, the second base substrate 210 and the first base substrate 110 are same. In some embodiments, the second base substrate 210 is free of via-holes.

As illustrated in FIG. 10, a first surface 212 of the second base substrate 210 is disposed on the front surface 122 that includes the first set of signal traces 142, the first terminal 152, the second terminal 154 and the third terminal 156. In some embodiments, the first surface 212 of the second base substrate 210 conforms to the first region 132 of the flexible circuit layer 130 disposed on the first base substrate 110. In the next step 24, the process 10 includes bending the flexible circuit layer 130 at the second intermediate region 135 to surround a thickness-side 218 of the second base substrate 210. The second intermediate region 135 may have a width equal to or more than the thickness of the second base substrate 210. In this situation, the front surface 122 of the dielectric layer 120 (in the second intermediate region 135) faces a thickness-side 218 of the second base substrate 210. The next step 24 further includes disposing the third region 136 of the flexible circuit layer 130 on a second surface 214 (opposite to the first surface 212) of the second base substrate 210. In these embodiments, the front surface 122 the dielectric layer 120 in the third region 136 (that includes the third set of the signal traces 146) is in contact with the second surface 214 of the second base substrate 210, as shown in FIG. 10. On completion of the step 24, the stacked printed circuit assembly 200 as shown in FIG. 10, is formed.

Referring to FIGS. 7, 9 and 11, in some embodiments, the process 10 further includes the step 22 of disposing the second base substrate 210 on the first region 132 that is disposed on the first surface 112 of the first base substrate 110, after performing the step 18. As illustrated in FIG. 11, the first surface 212 of the second base substrate 210 is disposed on the front surface 122 that includes the first set of signal traces 142, the first terminal 152 and the second terminal 154. In some embodiments, the first surface 212 of the second base substrate 210 conforms to the first region 132 of the flexible circuit layer 130 disposed on the first base substrate 110. In the next step 24, the process 10 includes bending the flexible circuit layer 130 at the second intermediate region 135 to surround a thickness-side 118 (opposite to thickness-side 116) of the first base substrate 110 and a thickness-side 218 of the second base substrate 210. In these embodiments, the second intermediate region 135 has a width more than the thicknesses of the first base substrate 110 and the second base substrate 210. In this situation, the back surface 124 of the dielectric layer 120 (in the second intermediate region 135) faces the thickness-sides 118 and 216 of the first and second base substrate (110, 210). Next, the step 24 further includes disposing the third region 136 of the flexible circuit layer 130 on a second surface 214 of the second base substrate 210. In some embodiments, the back surface 124 of the dielectric layer 120 in the third region 136 is in contact with the second surface 214 of the second base substrate 210, as shown in FIG. 11. On completion of the step 24, the stacked printed circuit assembly 300 as shown in FIG. 11, is formed.

In some embodiments, the steps 22 and 24 of the process 10 as shown in FIG. 7 may be repeated at least one more time to dispose a third base substrate and dispose a fourth region having a fourth set of signal traces of the flexible circuit layer on the fourth base substrate to form various configurations of stacked printed circuit assemblies.

Some embodiments of the present disclosure, thus, advantageously provide simple, robust and cost-effective processes for fabricating a printed circuit assembly by using a flexible circuit layer (i.e., flexible patterned layer). Use of such flexible circuit layer in fabricating printed circuit assemblies, as described herein, enables single sided fabrication of signal traces on a layer, avoids or prevents the need of having via-holes in the base substrates, enables the use of various dielectric substrates, and enables the use of thick dielectric substrates. Moreover, the use of flexible circuit layers enables the fabrication of flexible circuit layer including printed signal traces by additive manufacturing. These features and steps of the present disclosure thereby reduce the complexity and cost in processing, and enable easy and economic fabrication processing.

In some embodiments, a process may use at least two separate flexible patterned layers including signal traces. The at least two separate flexible patterned layers may be disposed on opposing surfaces of a base substrate. The signal traces of the at least two flexible patterned layers may be operatively coupled using a separate flexible circuit layer having an electrical interconnect deposited on a surface of the layer or a mechanical means such as soldered connector, conductive jumper. The separate flexible circuit layer having the electrical interconnect may be disposed on a thickness-side of the base substrate.

A printed circuit assembly, for example a RF interconnect according to embodiments of the present disclosure may be used in printed circuit boards for communication apparatuses, for example, in surface acoustic wave (SAW) sensing. Applications for the printed circuit assembly, as disclosed herein, include communication apparatuses for passive and active wireless sensing in various fields such as industrial, avionic and automotive systems, wearable electronics, and other applications where the flexible circuit layer (as discussed above) could be applied.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A process for fabricating a printed circuit assembly, comprising
providing a first base substrate having a first surface and a second surface opposite to the first surface;
providing a flexible circuit layer comprising a first region having a first set of signal traces and a second region having a second set of signal traces, wherein the first region and the second region are separated by a first intermediate region and wherein the first set of signal traces and the second set of signal traces comprise transmission lines;
disposing the first region of the flexible circuit layer on the first surface of the first base substrate;
bending the flexible circuit layer at the first intermediate region to surround a thickness side of the first base substrate; and
disposing the second region of the flexible circuit layer on the second surface of the first base substrate.

2. The process of claim 1, wherein the flexible circuit layer comprises a dielectric layer, and wherein the first set of signal traces and the second set of signal traces are disposed on a front surface of a dielectric layer.

3. The process of claim 2, wherein the dielectric layer comprises a dielectric material having a dielectric constant less than 5.

4. The process of claim 3, wherein the dielectric material comprises polyethylene terephthalate (PET), a polyimide, a glass or combinations thereof.

5. The process of claim 2, wherein the dielectric layer has a thickness in a range of from about 10 microns to about 100 microns.

6. The process of claim 1, wherein the first intermediate region is free of signal traces.

7. The process of claim 1, wherein the first set of signal traces is operatively coupled to the second set of signal traces via the first intermediate region.

8. The process of claim 7, wherein the first intermediate region comprises an electrical interconnect to operatively couple the first set of signal traces to the second set of signal traces.

9. The process of claim 1, further comprising:
disposing a second base substrate on the first region or the second region of the flexible circuit layer disposed on the first base substrate; and
disposing a third region of the flexible circuit layer on a surface of the second base substrate, wherein the third region comprises a third set of signal traces and is separated from the first region or the second region by a second intermediate region that is free of signal traces.

10. The process of claim 9, wherein the third set of signal traces is operatively coupled to the first set of signal traces or the second set of signal traces via the second intermediate region.

11. A printed circuit assembly, comprising:
a first base substrate having a first surface and a second surface opposite to the first surface; and
a flexible circuit layer comprising a first region having a first set of signal traces and a second region having a second set of signal traces separated from the first region by a first intermediate region, said flexible circuit layer is disposed on the first base substrate such that the first region is disposed on the first surface and the second region is disposed on the second surface, and wherein the first set of signal traces and the second set of signal traces comprise transmission lines and are operatively coupled via the first intermediate region.

12. The printed circuit assembly of claim 11, wherein the flexible circuit layer comprises a dielectric layer and the first set of signal traces and the second set of signal traces are disposed on a front surface of the dielectric layer.

13. The printed circuit assembly of claim 12, wherein the dielectric layer comprises a dielectric material having a dielectric constant less than 5.

14. The printed circuit assembly of claim 13, wherein dielectric material comprises a polyethylene terephthalate (PET), a polyimide, a glass or combinations thereof.

15. The printed circuit assembly of claim 12, wherein the dielectric layer has a thickness in a range of from about 10 microns to about 100 microns.

16. The printed circuit assembly of claim 11, wherein the first intermediate region is free of signal traces.

17. The printed circuit assembly of claim 11, wherein the first intermediate region comprises an electrical interconnect to operatively couple the first set of signal traces and the second set of signal traces.

18. The printed circuit assembly of claim 11, wherein the first intermediate region surrounds a thickness side of the first base substrate.

19. The printed circuit assembly of claim 18, wherein the first intermediate region has a width greater than a thickness of the first base substrate.

20. The printed circuit assembly of claim 11, wherein the first base substrate is free of via-holes.

* * * * *